US008228650B2

(12) United States Patent
Hara et al.

(10) Patent No.: US 8,228,650 B2
(45) Date of Patent: Jul. 24, 2012

(54) INPUT-OUTPUT INTERFACE CIRCUIT, INTEGRATED CIRCUIT DEVICE AND ELECTRONIC APPARATUS

(75) Inventors: Tomoko Hara, Chino (JP); Yoshihiko Nimura, Suwa (JP)

(73) Assignee: Seiko Epson Corporation (JP)

( * ) Notice: Subject to any disclaimer, the term of this patent is extended or adjusted under 35 U.S.C. 154(b) by 307 days.

(21) Appl. No.: 12/726,722

(22) Filed: Mar. 18, 2010

(65) Prior Publication Data

US 2011/0002072 A1 Jan. 6, 2011

(30) Foreign Application Priority Data

Jul. 1, 2009 (JP) .................................. 2009-156539

(51) Int. Cl.
*H02H 9/04* (2006.01)
(52) U.S. Cl. ......................................... 361/56; 361/91.1
(58) Field of Classification Search .................... 361/56, 361/91.1
See application file for complete search history.

(56) References Cited

U.S. PATENT DOCUMENTS

| 6,344,960 | B1 * | 2/2002 | Seo et al. ..................... 361/111 |
| 6,353,521 | B1 * | 3/2002 | Gans et al. ..................... 361/56 |
| 6,657,835 | B2 * | 12/2003 | Ker et al. ..................... 361/56 |
| 6,801,417 | B2 * | 10/2004 | Arai et al. ..................... 361/56 |
| 6,861,874 | B1 * | 3/2005 | Chen et al. ..................... 326/81 |
| 6,885,529 | B2 * | 4/2005 | Ker et al. ..................... 361/56 |
| 7,990,667 | B2 * | 8/2011 | Kawachi ..................... 361/56 |
| 2001/0033004 | A1 * | 10/2001 | Lin et al. ..................... 257/360 |
| 2002/0195648 | A1 * | 12/2002 | Hirata ..................... 257/315 |
| 2003/0235022 | A1 * | 12/2003 | Lai et al. ..................... 361/111 |
| 2010/0237945 | A1 * | 9/2010 | Cassia et al. ..................... 330/277 |
| 2011/0032647 | A1 * | 2/2011 | Kawachi ..................... 361/56 |

FOREIGN PATENT DOCUMENTS

| JP | 10-041457 | 2/1998 |
| JP | 2000-077996 | 3/2000 |

* cited by examiner

*Primary Examiner* — Rexford Barnie
*Assistant Examiner* — Angela Brooks
(74) *Attorney, Agent, or Firm* — Harness, Dickey & Pierce, P.L.C.

(57) ABSTRACT

An input-output interface circuit of the present invention includes an input-output terminal, an input buffer, a first MOS transistor of a first conductivity type formed in a floating well region, an output buffer for outputting a signal externally through the input-output terminal, an electrostatic protection circuit, and a floating well potential adjusting circuit, wherein the electrostatic protection circuit has a first resistance, and a diode connected between another end of the first resistance and a high level power supply potential, and the floating well potential adjusting circuit has a second resistance having one end connected to the input-output terminal, and a second MOS transistor of the first conductivity type having one end connected to another end of the second resistance, another end connected to the floating well region, and a gate connected to the high level power supply potential.

4 Claims, 5 Drawing Sheets

FIG. 5

US 8,228,650 B2

INPUT-OUTPUT INTERFACE CIRCUIT, INTEGRATED CIRCUIT DEVICE AND ELECTRONIC APPARATUS

The present application claims priority based on Japanese Patent Application 2009-156539 filed Jul. 1, 2009, and the application is herein incorporated in the present specification.

TECHNICAL FIELD

An aspect of the present invention relates to input-output interface circuits, integrated circuit devices and electronic apparatuses.

TECHNOLOGICAL BACKGROUND

Electrostatic protection circuits for integrated circuit devices are described, for example, in Patent Document 1 and Patent Document 2. Patent Document 1 describes an electrostatic protection circuit that protects an internal circuit from electrostatic destruction, when an excessive voltage is applied to an input-output pad (a common terminal for signal input and signal output), by circulating a transient current to a power supply line or a ground line via a resistor and a diode.

Also, Patent Document 2 describes an electrostatic protection circuit that composes a voltage tolerance circuit using the so-called floating N well technology. The voltage tolerance circuit does not have any particular definition, but is an input-output interface circuit that uses a circuit composition that does not allow an unnecessary current to flow from an input side to a power supply side when a voltage higher than the power supply voltage VDD of the internal circuit is inputted in an input-output pad or the like, thereby improving the voltage tolerance.

Also, the floating N-well technology is one of the methods for composing a voltage tolerance circuit in which, for example, the potential on an N-well region where a PMOS transistor is formed is not fixed at a high level power supply voltage VDD, and the voltage on the N-well is made adaptively adjustable. By this, when an excessive electrostatic surge or the like exceeding the VDD is applied to the source of the PMOS transistor, a parasitic diode present between its source (P-type impurity region) and the N-well is prevented from turning on, thereby preventing a large transient current from flowing in the power supply line (VDD line) through the parasitic diode, and thereby preemptively preventing malfunction of the circuit and destruction of the elements and wirings.

PRIOR ART TECHNOLOGY DOCUMENT

Patent Document

[Patent Document 1] Japanese Laid-open Patent Application H10-41457
[Patent Document 2] Japanese Laid-open Patent Application 2000-77996

SUMMARY OF THE INVENTION

Problems to be Solved by the Invention

By using an input-output interface circuit employing the electrostatic protection circuit that flows a transient current through a resistance and a diode to the power supply line and the ground line and the voltage tolerance circuit that uses the floating N-well technology, the electrostatic destruction tolerance and the ESD immunity can be improved, but latch-up may occur in the input-output interface circuit.

In accordance with at least one of embodiments of the present invention, it is possible to securely prevent generation of latch-up in an input-output interface circuit that uses, for example, an electrostatic protection circuit using at least one resistance and at least one diode, in combination with a voltage tolerance circuit using the floating well technology.

Means for Solving the Problems (1) An embodiment of an input-output interface circuit of the invention includes, an input-output terminal for signal input and output, an input buffer that receives a signal inputted externally through the input-output terminal, an output buffer that has a first MOS transistor of a first conductivity type formed in a floating well region, and outputs a signal externally through the input-output terminal, an electrostatic protection circuit connected between the input-output terminal and a high level power supply potential, and a floating well potential adjusting circuit that adjusts the potential on the floating well region, wherein the electrostatic protection circuit has a first resistance having one end connected to the input-output terminal, and a diode connected between another end of the first resistance and the high level power supply potential, and the floating well potential adjusting circuit has a second resistance having one end connected to the input-output terminal, and a second MOS transistor of the first conductivity type having one end connected to another end of the second resistance, another end connected to the floating well region, and a gate connected to the high level power supply potential.

For example, when a surge voltage with a positive polarity is applied to the input-output terminal, the current flows through the electrostatic protection circuit toward a high level power supply voltage line, whereby a voltage drop is caused in a resistance (for example, a current restricting resistance) included in the electrostatic protection circuit. If the current restricting resistance included in the electrostatic protection circuit does not commonly serve as a protection resistance (for example, an electrostatic protection resistance) in the floating well potential adjusting circuit, a parasitic PNP transistor present in the floating well region may be caused to turn on as its base-emitter is forward-biased by the voltage drop, whereby a parasitic thyristor may turn on, causing latch-up.

In contrast to the above, in accordance with the present embodiment, the resistance (first resistance) in the electrostatic protection circuit is separated from the resistance (second resistance) in the floating well potential adjusting circuit (a substrate potential adjusting circuit), such that, even when a surge current flows upon application of a surge voltage with a positive polarity to the input-output terminal, thereby causing a voltage drop in the first resistance, a current does not flow in the second resistance. Therefore, the base-emitter of the parasitic PNP transistor present in the floating well region is not forward-biased, and maintains its off state, whereby the parasitic thyristor does not turn on. Accordingly, generation of latch-up is reliably prevented.

(2) In another embodiment of the input-output interface circuit of the present invention, the floating well potential adjusting circuit has a third MOS transistor of the first conductivity type having a gate connected to another end of the second resistance, one end connected to the high level power supply potential, and another end connected to the floating well region.

The floating well potential adjusting circuit may have the third MOS transistor of the first conductivity type. The second MOS transistor recited in the above-described (1) turns on, for example, when an electrostatic surge exceeding the high level power supply voltage VDD is inputted in the input-output terminal, thereby maintaining the potential on the floating well to, for example, a potential generally equal to the potential on the input-output terminal, whereby a parasitic diode formed between the source or the drain and the well is prevented from being forward-biased such that an unnecessary current does not flow.

On the other hand, the third MOS transistor added in the present embodiment turns on, for example, when a voltage on the input-output terminal is lower than VDD, thereby maintaining the potential on the floating well to, for example, the high level power supply potential (VDD), whereby a parasitic diode formed between the source or the drain and the well is reverse biased. This ensures that an unnecessary current does not flow. Accordingly, the reliability of the input-output circuit further improves.

(3) An embodiment of an integrated circuit device of the present invention includes the input-output interface circuit recited above.

As described above, according to at least one of the embodiments of the input-output interface circuit of the present invention, generation of latch-up in the input-output interface circuit that uses an electrostatic protection circuit using at least one resistance and at least one diode in combination with a voltage tolerance circuit using the floating well technology can be reliably prevented. Accordingly, the integrated circuit device (IC) having the input-output interface circuit mounted thereon according to the present invention has sufficient electrostatic protection property and ESD immunity, such that the integrated circuit device (IC) with a high reliability can be realized.

(4) An embodiment of an electronic apparatus of the invention includes the integrated circuit device recited above.

As the integrated circuit device (IC) in accordance with the present invention is excellent in its reliability, the reliability of the electronic apparatus having the integrated circuit device (IC) according to the present invention mounted thereon is likewise improved.

EMBODIMENTS TO IMPLEMENT THE INVENTION

Next, embodiments of the present invention will be described with reference to the drawings. It is noted that the embodiments to be described below would not unduly limit the contents of the present invention recited in the scope of patent claims, and compositions described in the present embodiments would not necessarily be indispensable as means for solution given by the present invention.

Before describing the composition of the embodiment of the present invention, first, a composition example and an operation example of an input-output interface circuit that uses an electrostatic protection circuit in combination with a voltage tolerance circuit, and latch-up that is generated in the input-output interface circuit will be described with reference to FIG. 3 to FIG. 5.

(Description of Composition Example and Operation Example of Input-Output Interface Circuit, and Latch-Up)

Figure 3:
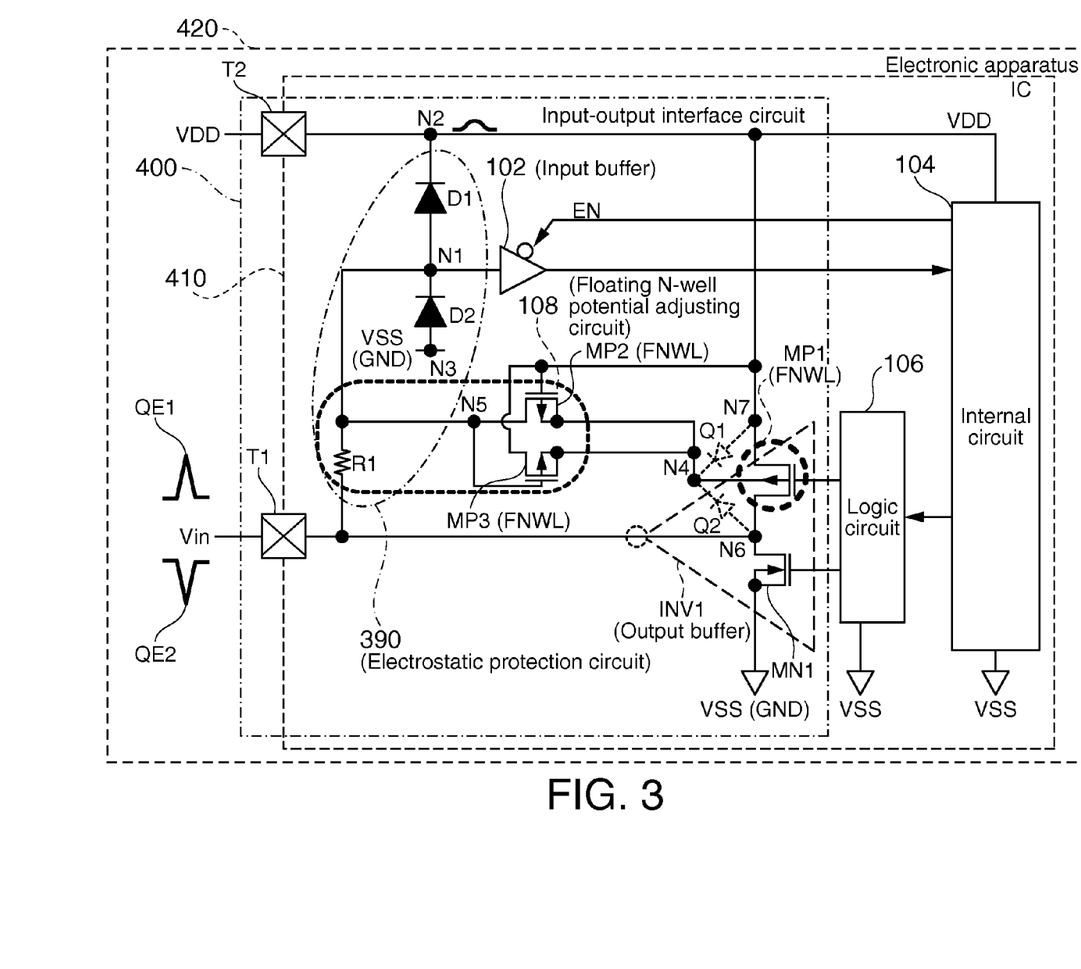
FIG. 3 is a figure for describing a composition example and an operation example of the input-output interface circuit, and latch-up.

FIG. 3 is a figure for describing latch-up in an input-output interface circuit. An input-output interface circuit 400 shown in FIG. 3 is provided in an integrated circuit device (IC) 410, and the integrated circuit device (IC) 410 is mounted on an electronic apparatus 420.

The input-output interface circuit 400 includes, an input-output terminal T1, a power supply terminal (VDD terminal) T2, an output buffer INV1 that externally outputs a signal through the input-output terminal T1, an input buffer (for example, a tri-state buffer) 102 that receives a signal inputted externally through the input-output terminal T1, an electrostatic protection circuit 390 (including a resistance (an electrostatic protection resistance: more specifically, for example, a current restricting resistance) R1 and a diode D1), and a floating N-well potential adjusting circuit (a substrate potential adjusting circuit) 108 that adjusts the potential on a floating N-well (FNWL: a substrate in a broad sense). It is noted that the conductivity type of the floating well is not limited to N type, but the description herein is made assuming that an N-well is used as the floating well.

The floating N-well potential adjusting circuit 108 includes two PMOS transistors (MP2 (FNWL), MP3 (FNWL)) formed in the floating N-well. The resistance R1 also serves as an electrostatic protection resistance for the floating N-well potential adjusting circuit 108.

In the input-output interface circuit shown in FIG. 3, the input-output terminal T1 serves as an input terminal and an output terminal. Also, the input-output interface circuit of FIG. 3 is a bidirectional interface circuit, having an input buffer 102 and an output buffer INV1. The input buffer 102 and the output buffer INV1 complementarily operate. In other words, when one of the buffers is on, the other buffer maintains an off state. The input buffer 102 is, for example, a tri-state buffer, wherein the output node of the input buffer 102 is placed in a high impedance state, when a control signal EN assumes an active level.

The input buffer 102 transfers an input signal inputted in the input-output terminal T1 to an internal circuit 104. The output buffer INV1 may be composed of, for example, a CMOS buffer using a CMOS, and the output buffer INV1 has a P-type first MOS transistor MP1 (FNWL) and an N-type MOS transistor MN1 that are formed in the floating N-well (FNWL). On/Off of each of the P-type first MOS transistor MP1 (FNWL) and the N-type MOS transistor MN1 is controlled by two control signals (complementary signals) outputted from a logic circuit 106.

It is noted that the notation of "MP1 (FNWL)" indicates a "first PMOS transistor formed in the floating N well" (and notations concerning the other transistors are similarly made).

Also, the diode D1 for electrostatic protection is provided between a first node N1 that is an input node of the input buffer 102 and a second node N2 that is a high level power supply potential (VDD) node. Also, the diode D2 for electrostatic protection is provided between the first node N1 and a low level power supply potential node N3 (for example, GND). The diode D1 turns on, when a voltage with a positive polarity (a positive polarity noise) QE1 that exceeds the high level power supply potential VDD is inputted in the input-output terminal T1, and functions to have a transient current generated by the excess voltage QE1 quickly escape to a VDD supply line (VDD line). The diode D2 turns on, when a voltage with a negative polarity (a negative polarity noise) QE2 that is lower than the low level power supply potential VSS (GND) is inputted in the input-output terminal T1, and functions to have the current flow through the third node (VSS node) N3, thereby having the negative polarity voltage QE2 escape to VSS (=GND).

Also, the floating N-well potential adjusting circuit (a substrate potential adjusting circuit) 108 for adjusting the potential on the floating N-well (FNWL: a substrate in a broad sense) is composed of a P-type second MOS transistor MP2 (FNWL) formed in the floating N-well region (FNWL) and a P-type third MOS transistor MP3 (FNWL) formed in the floating N-well region (FNWL).

The second MOS transistor MP2 (FNWL) is provided between a fifth node N5 that is a node on the other end of the first resistance R1 and a fourth node N4 that is a potential node of the floating N-well (FNWL). The second MOS transistor MP2 (FNWL) has a gate connected to the high level power supply potential VDD. The second MOS transistor MP2 (FNWL) turns on, when a voltage exceeding the high level power supply potential VDD is applied to the input-output terminal T1, thereby applying a voltage of the fifth node N5 to the floating N-well region FNWL (in other words, to the fourth node N4).

Also, the third MOS transistor MP3 (FNWL) is similarly provided between the fourth node N4 and the fifth node N5. The third MOS transistor MP3 (FNWL) turns on, when the voltage level on the input-output terminal T1 is below the high level power supply potential (VDD) (in other words, when the input voltage Vin of the input-output terminal T1≦VDD), thereby applying, for example, the high level power supply voltage VDD to the floating N-well region (FNWL).

The input-output interface circuit 400 is a voltage tolerance circuit having a tolerance structure (also called an input tolerance circuit) that has sufficient tolerance against voltages. The tolerance structure is realized by using the floating well technology.

Here, the "floating well region" is a "well region in which the potential is not fixed, and the potential can be adaptively adjusted (which may be a semiconductor substrate in a broad sense, and may be a semiconductor region where transistor elements (of N-type or P-type in general) are formed." When the potential of the well is fixed at, for example, VDD, and an excessive voltage (an electrostatic surge, a noise or the like) is inputted in the input-output terminal, a transient current generated by the excessive voltage flows toward the VDD side. If there is no element provided for restricting the current amount of the current, the excessive current circulates, which may cause, for example, melting of wirings and destruction of elements, or result in latch-up. Also, if a parasitic diode turns on, the potential of the N-well lowers by a forward direction voltage of the diode, which causes a change in the Vth (threshold voltage) of a MOS transistor formed in the floating well. Accordingly, without fixing the potential of the well region, the potential is made to be adjustable according to statuses, such that the parasitic diode is prevented from turning on, and destruction of elements and changes in the threshold value by an excessive current can be prevented, whereby a voltage tolerance circuit is composed. This is the reason of using the floating well.

For example, when an excessive voltage with a positive polarity (a voltage exceeding the high potential power supply voltage VDD) QE1 is applied to the input-output terminal T1, the second MOS transistor MP2 (FNWL) turns on, as described above, and the voltage on the fifth node N5 (i.e., the voltage QE1 with a positive polarity) is applied to the floating N-well region FNWL (i.e., the fourth node N4). Although a parasitic diode Q2 is present between the fourth node N4 and the sixth node N6, a forward direction voltage is not generated in the parasitic diode Q2, because the sixth node N6 (an anode of the parasitic diode Q2) and the fourth node N4 (a cathode of the parasitic diode Q2) both have the voltage with a positive polarity QE1, whereby the parasitic diode Q2 is reliably prevented from turning on. Although a parasitic diode Q1 is present between the fourth node N4 and the seventh node N7, the parasitic diode Q1 is reverse biased, and therefore remains to be off, because the potential of the fourth node N4 is QE1 (>VDD), and the potential on the seventh node N7 is VDD.

Also, for example, when the potential on the input-output terminal T1 is lower than VDD, the third MOS transistor MP3 (FNWL) turns on, as described above, thereby applying VDD to the floating N-well region FNWL (i.e., the fourth node N4). As the fourth node N4 (the cathode of the parasitic diode Q2) is maintained at VDD (the highest potential), the parasitic diode Q2 is reverse biased, whereby the parasitic diode Q2 maintains its off state. Similarly, as the fourth node N4 (cathode) and the seventh node N7 (anode) both become to have VDD, the parasitic diode Q1 also maintains its off state. In this manner, the substrate potential (i.e., the floating N-well potential) is always optimized by the floating N-well potential adjusting circuit 108, such that the parasitic diodes Q1 and Q2 are reliably prevented from turning on, regardless of the potential on the input-output terminal T1, and unnecessary forward direction current of the parasitic diodes can be prevented from flowing, whereby the voltage tolerance (reliability) of the circuit can be improved.

(Description of Latch-Up)

Next, latch-up generated in the input-output interface circuit of FIG. 3 will be described with reference to FIG. 4. FIG. 4 is a circuit diagram of a parasitic thyristor generated in the input-output interface circuit of FIG. 3. In FIG. 4, the power supply voltage VDD to be inputted in the VDD terminal T2 is 0 V.

Figure 4:
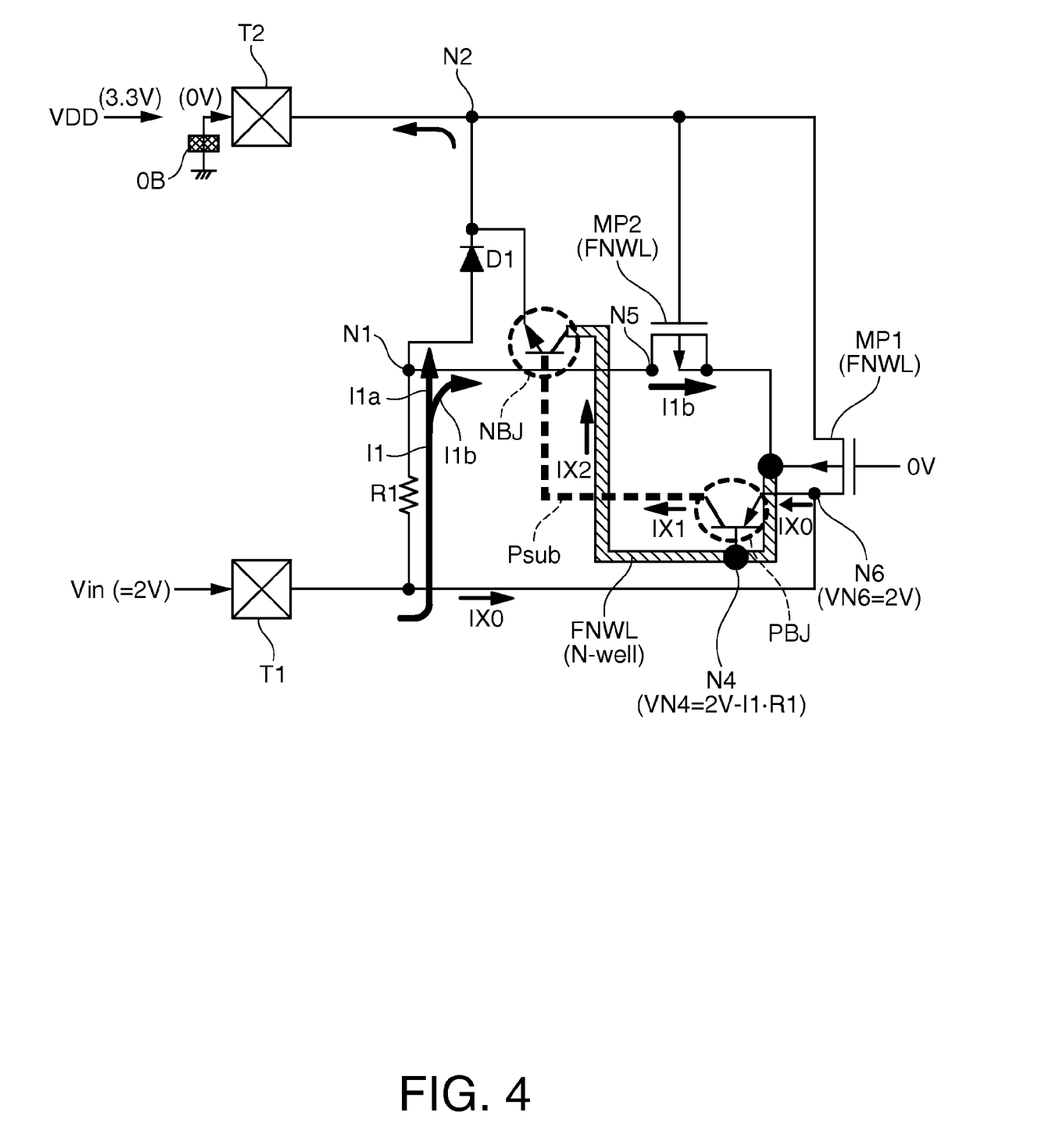
FIG. 4 is a circuit diagram showing a parasitic thyristor created in the input-output interface circuit of FIG. 3.

As shown in FIG. 4, a parasitic thyristor is formed by a parasitic PNP transistor PBJ and a parasitic NPN transistor NBJ. When the parasitic PNP transistor PBJ turns on, the parasitic thyristor turns on, thereby causing latch-up. The latch-up would likely be generated when a voltage greater than the power supply voltage VDD is applied to the input-output terminal T1. For example, when a voltage (the voltage applied may not be limited to an electrostatic surge, but may be a voltage at a voltage level within the normal operation range to be applied at the time of normal operation of the integrated circuit device (IC)) is applied to the input-output terminal T1 in a state in which (a supply line of) the power supply voltage VDD is at 0V (or a potential near 0V) for some reasons, latch-up could be generated. The state in which the power supply voltage VDD is short-circuited to 0V, and a voltage at a level to the extent that a current can be circulated in the resistance R1 is applied to the input-output terminal T1 can occur when, as shown in FIG. 4 in its upper left area, a normal input voltage (a high level voltage) is applied to the input-output terminal T1 in a state in which the VDD supply line is short-circuited to 0V because the input line of VDD is broken, and a conductive foreign object OB is connected to the VDD supply line that connects to the VDD terminal T2. Also, for example, latch-up can occur when the input-output terminal for signals is shared by another chip, and a signal at H level is inputted in the input-output terminal T1 in a state in which the power supply voltage is 0V. Also, latch-up can occur even in a state in which the power supply voltage VDD is supplied to the chip, if a spike noise or the like higher than the power supply voltage VDD is inputted in the input-output terminal.

Concrete description is made below. In the circuit shown in FIG. 4, a resistance (an electrostatic protection resistance or an input resistance, which is a resistance having, for example, a current restricting function) R1 composing the electrostatic protection circuit 390 is commonly used for protection of the input buffer 102 and for protection of the floating N-well potential adjusting circuit 108.

Therefore, when a voltage is applied to the input-output terminal T1, and a current I1 flows from the input-output terminal T1 to the terminal T1 for supplying VDD (VDD in this instance is, for example, at 0V, as described above), a voltage generated across both ends of the resistance R1 which is influenced by a voltage drop is also inevitably transmitted to the floating N-well potential adjusting circuit 108, passing through the second MOS transistor MP2 as the second MOS transistor MP2 composing the floating N-well potential adjusting circuit 108 turns on, and transmitted to the first MOS transistor MP1 (FNWL) formed in the floating well region (FNWL) composing the output buffer INV1, such that, as a result, the potential on the floating well region (FNWL) (i.e., the potential on the fourth node N4) lowers. As shown in FIG. 4, a potential VN4 on the fourth node N4 can be expressed by 2V−I1·R1, when an input voltage Vin is 2V. It is understood that the potential on the floating N-well (the potential on the fourth node N4) is lowered by the amount of a voltage drop at the electrostatic protection resistance R1.

On the other hand, as the output node of the output buffer INV1 is connected to the input-output terminal T1, a voltage applied to the input-output terminal T1 is transferred directly to the output node of the output buffer INV1, and transferred to the first MOS transistor MP1 (FNWL) formed in the floating well region (FNWL) that composes the output buffer INV1, whereby, for example, the potential at a drain (the sixth node N6) of the first MOS transistor MP1 (FNWL) rises.

As a result, a parasitic PN junction diode present between the drain of the first MOS transistor MP1 (FNWL) and the floating well (i.e., a diode between the base and the emitter of the parasitic PNP transistor PBJ composing the parasitic thyristor) turns on, and the parasitic PNP transistor PBJ turns on.

In FIG. 4, I1b denotes a current that is a base current for the parasitic PNP transistor PBJ, IX0 denotes an emitter current, and IX1 denotes a collector current. The collector current IX1 of the parasitic PNP transistor PBJ is injected in the semiconductor substrate (a substrate that is a base for forming the floating well, which is a P-type substrate Psub of a conductivity type opposite to that of the floating N-well region).

Further, the diode D1 (at least one diode) composing the electrostatic protection circuit is provided between the first node N1 and the second node N2 that is a high level power supply potential node (VDD node), such that there exists the parasitic NPN transistor NBJ with the cathode of the diode D1 (i.e., the second node N2) as an emitter, the P-type semiconductor substrate (Psub) as a base, and the floating N-well region (FNWL) as a collector.

The current (IX2 in FIG. 4) injected in the semiconductor substrate (Psub) by the parasitic PNP transistor PBJ drives the base of the parasitic NPN transistor NBJ, thereby turning on the parasitic thyristor formed between the input-output terminal T1 and the VDD terminal T2 (a high level power supply terminal: 0 V state).

In this case, the input-output terminal T1 apparently functions as a VDD terminal, and the VDD terminal T1 functions as a GND terminal. As the parasitic thyristor operates with the voltage Vin applied to the input-output terminal T1 (for example, 2V) as a power supply voltage, the ON state is maintained until the voltage application to the input-output terminal T1 is completed. As the parasitic thyristor does not have a current restricting function, a current without current restriction continues flowing while the parasitic thyristor is ON.

Figure 5:
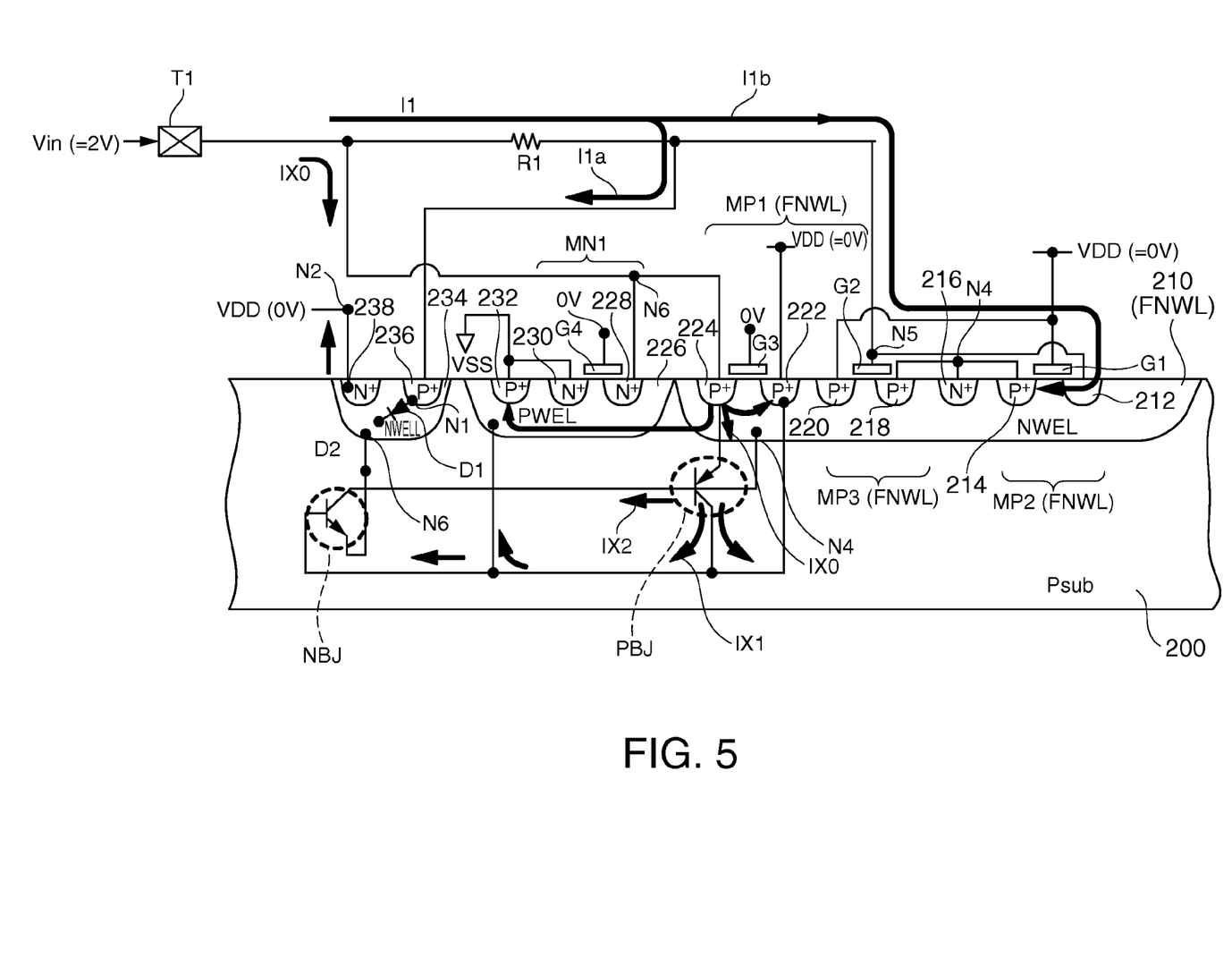
FIG. 5 is a cross-sectional view of an integrated circuit device, for describing the mechanism of latch-up generation shown in FIG. 3.

FIG. 5 is a cross-sectional view of an integrated circuit device, for describing the latch-up generation mechanism shown in FIG. 4. In FIG. 5, a floating N-well (FNWL: also described as NWEL) 210 is formed in a P-type semiconductor substrate (Psub) 200, and a P-well (PWEL) 226 for forming an NMOS transistor MN1 that composes the output buffer INV1 is formed.

In the floating N-well 210 (FNWL), there are formed $P^+$ regions 222 and 224 that are composing elements of a first MOS transistor MP1 (FNWL), $P^+$ regions 212 and 214 that are composing elements of a second MOS transistor MP2 (FNWL), $P^+$ regions 218 and 220 that are composing elements of a third MOS transistor MP3 (FNWL), and an $N^+$ region 216 that is a potential lead-out layer of the floating N-well 210 (FNWL).

Also, in the P-well 226, there are formed $N^+$ regions 228 and 230 that are composing elements of an MNOS transistor MN1 that composes an output buffer INV1, and a $P^+$ region 232 that is a potential lead-out layer.

Also, in the N-well 234, a P-layer 236 that functions as an anode of a diode, and an N-layer 238 that functions as a cathode thereof are formed. It is noted that, in FIG. 5, each of G1-G4 denotes a gate electrode composed of, for example, polysilicon or the like.

In FIG. 5, when a parasitic thyristor turns on, unnecessary currents flow in various portions, as indicated by thick arrows, and the currents continue until the input voltage Vin that is a power supply voltage becomes to be L level. Therefore, a countermeasure to securely prevent such latch-up is necessary.

First Embodiment

Figure 1:
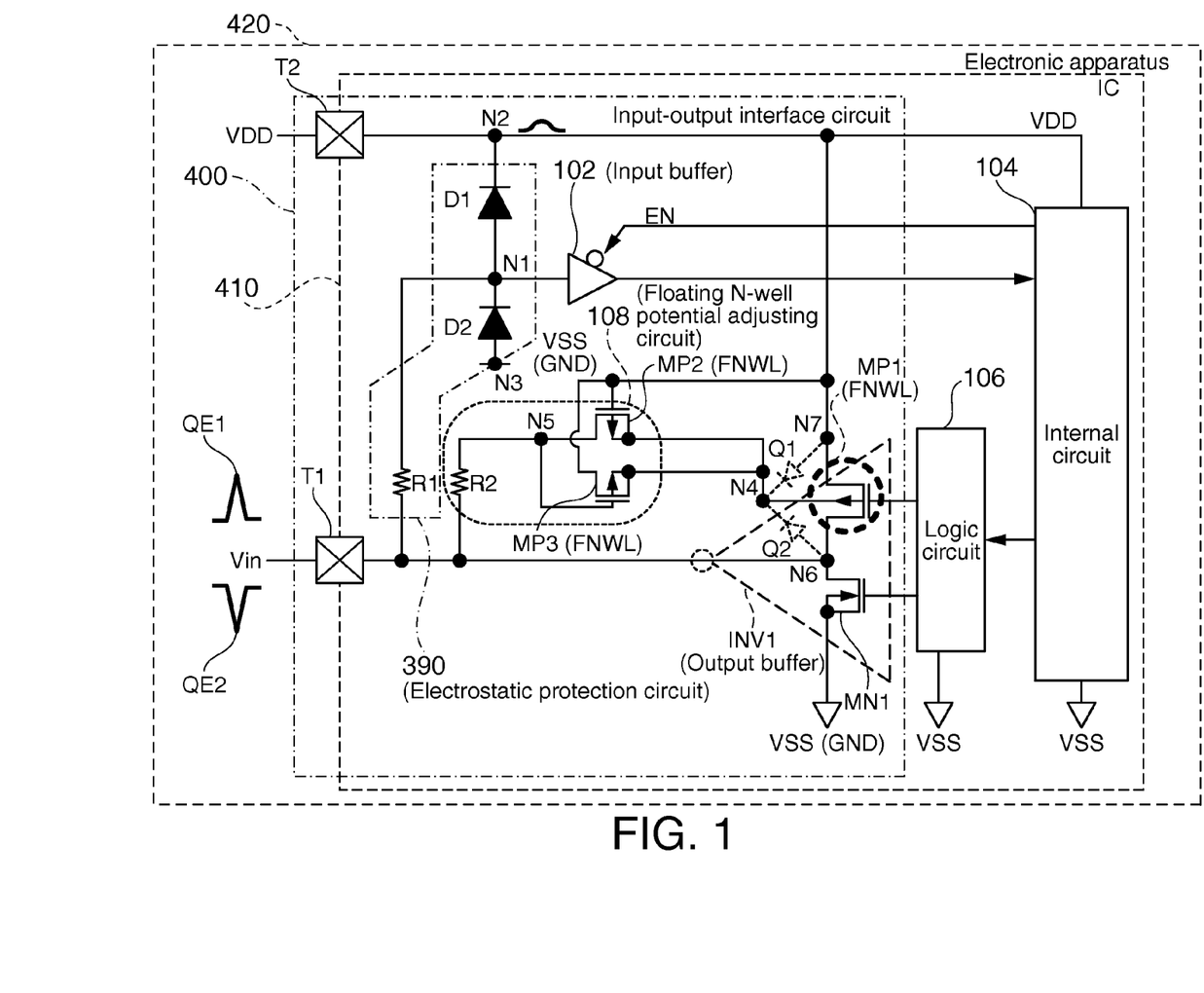
FIG. 1 is a figure showing an example of the composition of an input-output interface circuit (and the composition of an integrated circuit device having the input-output interface circuit) of the present invention.

Hereunder, a first embodiment of the invention will be described. FIG. 1 is a figure showing an example of the composition of an input-output interface circuit (and the composition of an integrated circuit device having the input-output interface circuit) of the present invention. In FIG. 1, parts common to those in FIG. 3 are appended with common reference codes.

An input-output interface circuit 400 shown in FIG. 1 uses two resistances (a first resistance R1 and a second resistance R2). The first resistance R1 is a resistance included in an electrostatic protection circuit 390, and is provided in a path leading from an input-output terminal T1 to a supply line of a high level power supply voltage (VDD).

On the other hand, the second resistance R2 is a resistance for protecting the floating N-well potential adjusting circuit 108, and is provided in a path leading from the input-output terminal T1 to a circuit including the floating well (FNWL) (more concretely, for example, a PMOS transistor MP1 (FNWL) that composes the output buffer INV1) (in other words, in a path different from the path in which the first resistance R1 is inserted). In other words, the second resistance R2 is provided between the input-output terminal T1 and an input node N5 of the floating N-well potential adjusting circuit 108.

In FIG. 1, it is assumed that the VDD supply line is at a voltage near 0V, and a voltage Vin (for example, 2V) is supplied to the input-output terminal T1. In this case, a current circulates, through the first resistance R1, from the input-output terminal T1 to the supply line of the high level power supply voltage (VDD), and a voltage drop is generated across both ends of the first resistance R1. However, as the path leading through the first resistance R1 to the VDD line is a path different from the path leading through the second resistance R2 to the circuit including the floating well, the voltage drop generated across the two ends of the first resistance R1 does not influence the potential on the floating well (FNWL) at all, whereby the floating well maintains its state in which the potential is stabilized.

In other words, no voltage drop occurs across the two ends of the second resistance R2, such that, when the transistor MP2 (FNWL) composing the floating N-well potential adjusting circuit (the floating well potential adjusting circuit, the substrate potential adjusting circuit) 108 turns on, the input voltage Vin applied to the input-output terminal T1 is supplied intact to the floating N-well (FNWL). Accordingly, a potential difference is scarcely generated between the potential at the drain (the sixth node N6) of the first MOS transistor MP1 (FNWL) that composes the output buffer INV1 and the potential (the potential on the fourth node N4) of the floating N-well. Accordingly, no current flows from the drain (the node N6) of the PMOS transistor MP1 (FNWL) that composes the output buffer INV1 to the floating N-well (the node N4) (in other words, a current path to the floating well is not formed), and the parasitic PNP transistor (the parasitic PNP transistor PBJ shown in FIG. 4, FIG. 5) does not turn on, whereby latch-up can be reliably prevented.

The circuit structure of the input-output interface circuit 400 shown in FIG. 1 has a simplified circuit structure in which the two resistances (R1 and R2) are used as the electrostatic protection resistance (an input resistance) to divide the path into two paths, such that its realization is extremely easy, without causing any complication of the circuit structure, without causing any problem of cost increase, or without causing any problems concerning increased chip area and element layout.

Figure 2:
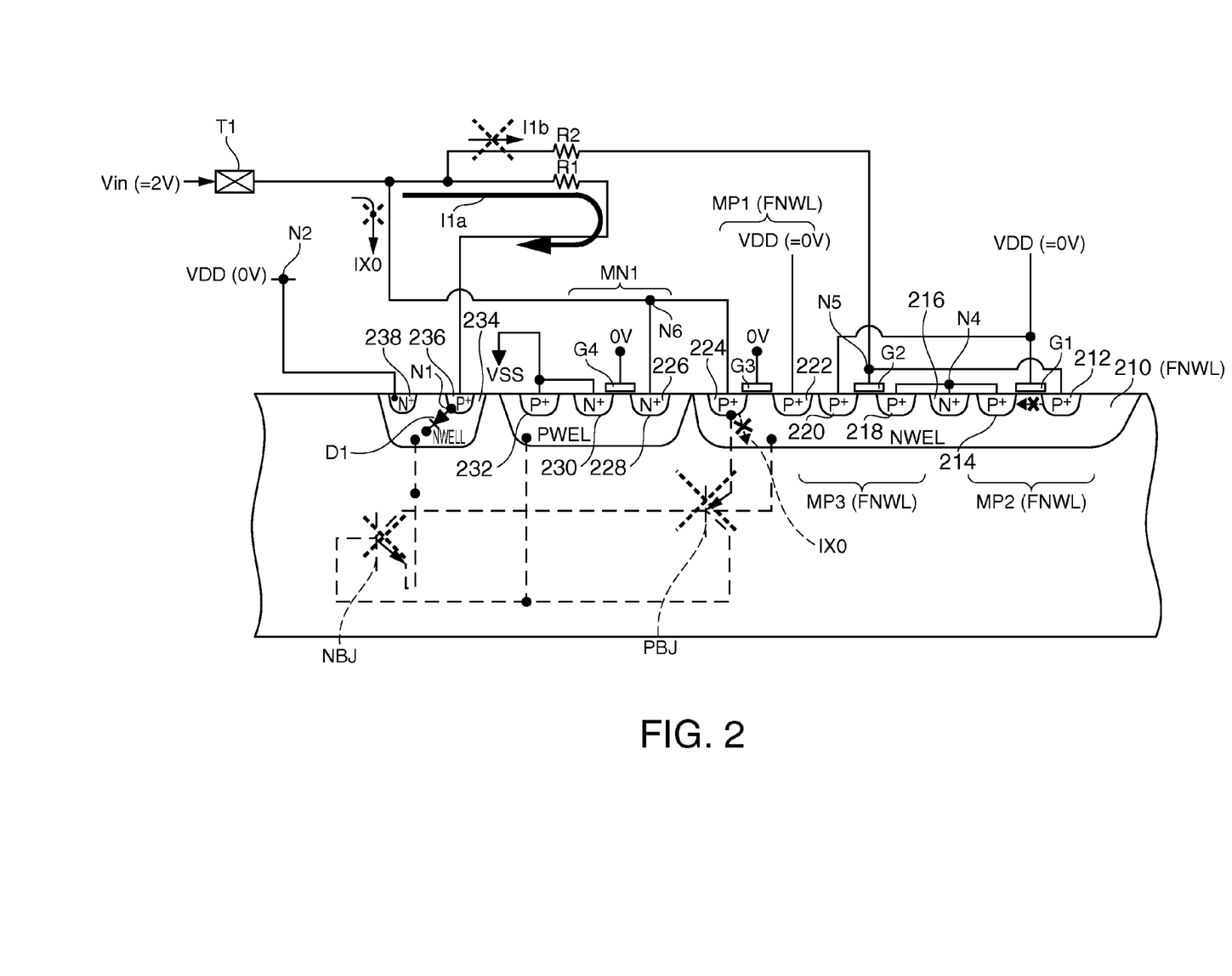
FIG. 2 is a cross-sectional view of the integrated circuit device with the input-output interface circuit shown in FIG. 1 formed therein.

FIG. 2 is a cross-sectional view of an integrated circuit device with the input-output interface circuit shown in FIG. 1 formed therein. In FIG. 2, parts common to those in FIG. 5 are appended with common reference codes. In FIG. 2, when an input voltage Vin at a high level is supplied to an input-output terminal T1, a current I1a flows through a first resistance R1 (a first electrostatic protection resistance R1), causing a voltage drop. However, the voltage drop does not influence the potential on the floating N-well, such that a current path passing through the floating N-well is not formed, and therefore a current I1b that passes through a second resistance R2 is not generated.

In FIG. 2, arrows indicating currents with x marks added thereto express that unnecessary currents flowing in the circuit prior to the present invention shown in FIG. 5 are not generated in the circuit of the present invention shown in FIG. 2. Similarly, in FIG. 2, a parasitic PNP transistor PBJ and a parasitic NPN transistor NBJ composing a parasitic thyristor are added with x marks. This means that the parasitic PNP transistor PBJ and the parasitic NPN transistor NBJ maintain their OFF state, and do not switch to ON state, such that the parasitic thyristor is not generated.

In this manner, according to the input-output interface circuit 400 shown in FIG. 2, for example, the latch-up that may possibly be generated under special circumstances, like the above-described example, is reliably prevented by the simple composition, such that the voltage immunity (voltage tolerance) of the input-output interface circuit (an input output circuit) 400 can be effectively enhanced.

In this manner, according to at least one of the embodiments of the invention, for example, it is possible to reliably prevent generation of latch-up in an input-output interface circuit that uses an electrostatic protection circuit that uses, for example, at least one resistance and at least one diode in combination with a voltage tolerance circuit that uses the floating well technology, whereby it is possible to improve the reliability of an integrated circuit device with the input-output interface circuit provided therein, and of an electronic apparatus with the integrated circuit device mounted thereon.

The embodiments are described in detail, but a person having ordinary skill in the art can readily understand that many modifications can be made within the range that does not depart from the novelty and the effect of the invention. Therefore such modification examples are deemed to be entirely included in the present invention. For example, in the explanation provided above, a circuit that uses a floating N-well is described, but the present invention is similarly applicable to a circuit that uses a floating P-well.

The invention claimed is:

1. An input-output interface circuit characterized in comprising:
    an input-output terminal for signal input and output;
    an input buffer that receives a signal inputted externally through the input-output terminal;
    an output buffer that has a first MOS transistor of a first conductivity type formed in a floating well region, and outputs a signal externally through the input-output terminal;
    an electrostatic protection circuit connected between the input-output terminal and a high level power supply potential; and
    a floating well potential adjusting circuit that adjusts the potential on the floating well region, wherein
    the electrostatic protection circuit has a first resistance having one end connected to the input-output terminal, and a diode connected between another end of the first resistance and the high level power supply potential, and
    the floating well potential adjusting circuit has a second resistance having one end connected to the input-output terminal, and a second MOS transistor of the first conductivity type having one end connected to another end of the second resistance, another end connected to the floating well region, and a gate connected to the high level power supply potential.

2. An input-output interface circuit recited in claim 1, characterized in that the floating well potential adjusting circuit further has a third MOS transistor of the first conductivity type having a gate connected to another end of the second resistance, one end connected to the high level power supply potential, and another end connected to the floating well region.

3. An integrated circuit device characterized in comprising the input-output interface circuit recited in claim 1.

4. An electronic apparatus characterized in comprising the integrated circuit device recited in claim 3.

* * * * *